United States Patent
Lu et al.

(10) Patent No.: US 7,430,121 B2
(45) Date of Patent: Sep. 30, 2008

(54) HEAT SINK FASTENER

(75) Inventors: Cui-Jun Lu, Shenzhen (CN); Jin-Song Feng, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,665

(22) Filed: Sep. 7, 2006

(65) Prior Publication Data

US 2007/0195507 A1 Aug. 23, 2007

(30) Foreign Application Priority Data

Feb. 17, 2006 (CN) .................... 2006 1 0338348

(51) Int. Cl.
*H05K 7/20* (2006.01)
*H01L 23/36* (2006.01)

(52) U.S. Cl. ................ 361/719; 361/702; 361/704; 361/717; 165/80.3; 165/104.33; 165/185

(58) Field of Classification Search ......... 361/702–712, 361/717–719, 722–724; 165/80.3, 80.4, 165/185, 104.33; 174/16.3; 257/707–718, 257/720–727; 248/316.7, 505, 510; 24/295, 24/457, 458, 495, 505, 517, 296, 625; 29/890.03, 29/832, 840
See application file for complete search history.

(56) References Cited

U.S. PATENT DOCUMENTS

| | | | |
|---|---|---|---|
| 6,731,504 B1 * | 5/2004 | Liu | 361/704 |
| 7,061,764 B2 * | 6/2006 | Lai et al. | 361/704 |
| 7,280,361 B1 * | 10/2007 | Lin | 361/704 |
| 7,292,442 B2 * | 11/2007 | Yu et al. | 361/704 |
| 7,292,444 B1 * | 11/2007 | Yang et al. | 361/709 |
| 2004/0190262 A1 * | 9/2004 | Lai et al. | |
| 2005/0144764 A1 * | 7/2005 | Lin | 24/459 |

* cited by examiner

*Primary Examiner*—Michael V Datskovskiy
(74) *Attorney, Agent, or Firm*—Frank R. Niranjan

(57) ABSTRACT

A heat sink fastener includes a main body, a piercing body and an operating member. The main body has a pressing part for pressing a heat sink toward a heat-generating component. An engaging part and a latching leg are disposed at opposite ends of the main body. The piercing body includes a piercing part piercing through the engaging part, and a latching part below the piercing part. The operating member includes a cam pivotally connected to the piercing part and rotatable between locked and unlocked positions. At the locked position, a protrusion formed on the cam abuts a lateral edge of the piercing part to prevent the operating member from spontaneously rotating back to the unlocked position. A bent flange is formed at a periphery of the cam and engages with the engaging part.

15 Claims, 6 Drawing Sheets

HEAT SINK FASTENER

FIELD OF THE INVENTION

The present invention relates generally to a heat sink fastener, and more particularly to a heat sink fastener for securing a heat sink to an electronic heat-generating component to remove heat from the heat-generating component.

DESCRIPTION OF RELATED ART

Heat sinks are usually used to remove heat from electronic heat-generating components, such as central processing units (CPUs) and the like, to keep the components at stable operation temperatures. A typical heat sink comprises a base for contacting a heat-generating component to absorb the heat of the heat-generating component and a plurality of fins extending from the base for dissipating the heat to ambient air.

To secure the heat sink to the heat-generating component, a fastener is required. A current fastener is disclosed in US Patent Application Publication No. 2005/0144764A1. The fastener comprises a pressing member, an engaging member and a handle. The pressing member comprises an elongated elastic bent section with a hooked end at an end thereof. The hooked end defines an engaging hole therein for engaging with an engaging jut of a base which surrounds the heat-generating component. A slot is defined in an opposite end of the bent section. The engaging member at an end thereof has a joining part which is provided with a fitting hole for receiving another engaging jut of the base. The engaging member at an opposite end thereof has a piercing part which can pass through the slot. The handle at an end thereof is a pivotal end pivotally connected with the piercing part. A cam is provided on the pivotal end. The handle at an opposite end thereof has a pressing part to pivot the handle relative to the engaging member so that the cam is driven to move on the elastic bent section.

In use of the fastener to secure the heat sink to the base, the handle at the pressing part is pressed down to allow the handle to pivot relative to the pivotal joint of the handle and the engaging member. The cam exerts a force on the elastic bent section such that the elastic bent section can generate tensile deformation against the heat sink to secure the heat sink to the heat-generating component firmly. However, being formed by a thin flat plate, the edge of the cam is prone to becoming wedged in the slot at an end of the fastener when the handle pivots. This renders the operation of the fastener difficult.

As well as this, in order to prevent the handle from rotating back, an extension section having a hook at a distal end thereof is provided laterally from the opposite end of the handle. The hook fastens to a lateral side of the base to enhance the engaging effect of the fastener. However, the provision of the extension section for preventing the handle from rotating back makes the structure of the fastener both more complicated and more expensive.

What is needed is a heat sink fastener capable of preventing the operating member such as handle from rotating back whilst still being economical and simple in structure.

SUMMARY OF THE INVENTION

A heat sink fastener in accordance with a preferred embodiment of the present invention includes a main body, a piercing body and an operating member. The main body includes a pressing part for pressing a heat sink toward a heat-generating component, an engaging part and a latching leg, the engaging part and the latching leg being disposed at opposite ends of the pressing part. The piercing body includes a piercing part piercing through the engaging part, and a latching part below the piercing part and facing the latching leg. The operating member includes a cam pivotally connected to the piercing part and rotatable to put the pressing part under tension by exerting a force on the engaging part. The operating member is also capable of relaxing the tension by relieving the force exerted on the engaging part. The cam forms a protrusion abutting the lateral edge of the piercing part to prevent the operating member from spontaneously rotating back when in the locked position.

Other advantages and novel features will become more apparent from the following detailed description of preferred embodiments when taken in conjunction with the accompanying drawings, in which:

DETAILED DESCRIPTION OF THE INVENTION

Figure 1:
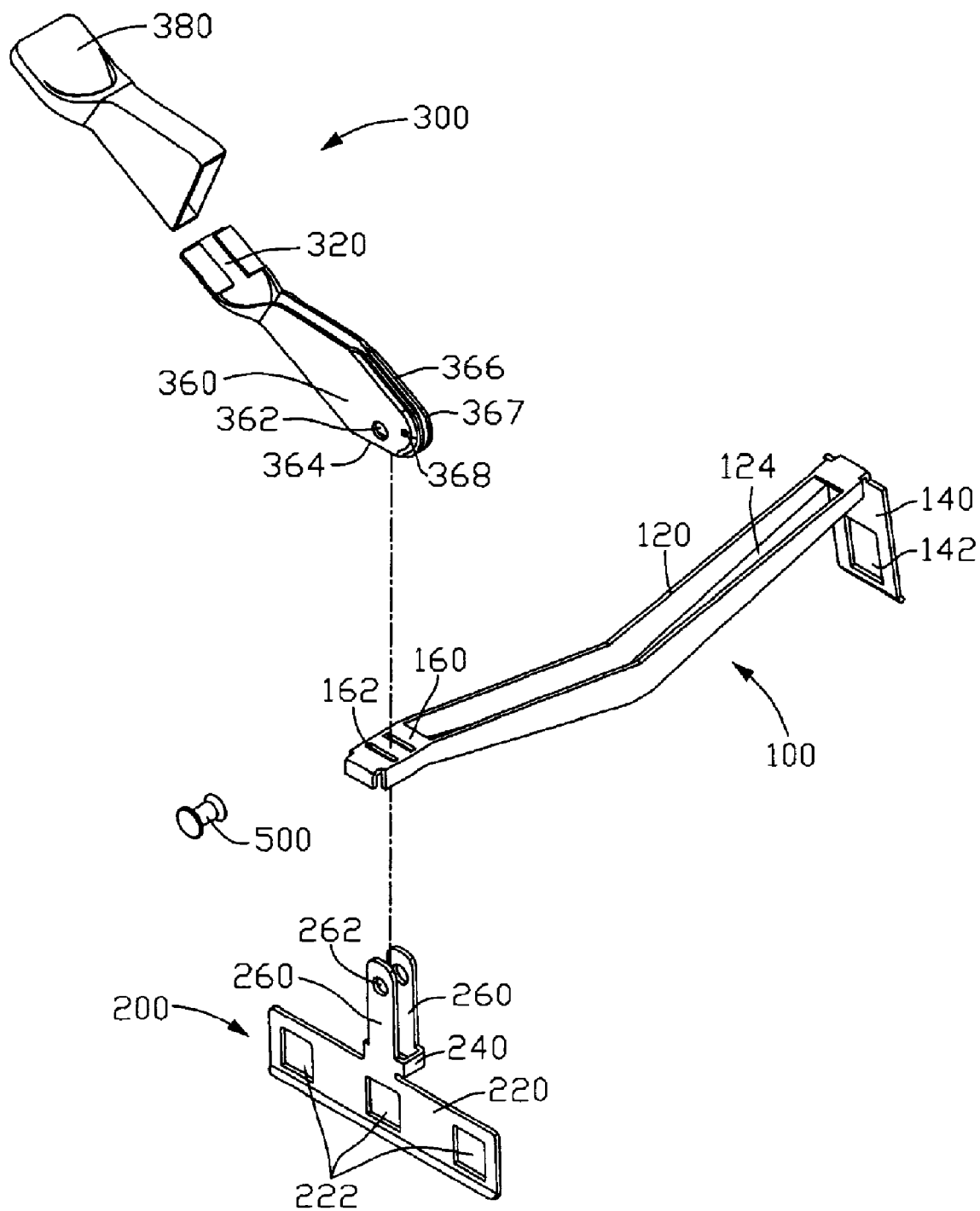
FIG. 1 is an exploded, isometric view of a heat sink fastener of a preferred embodiment in accordance with the present invention.
Figure 2:
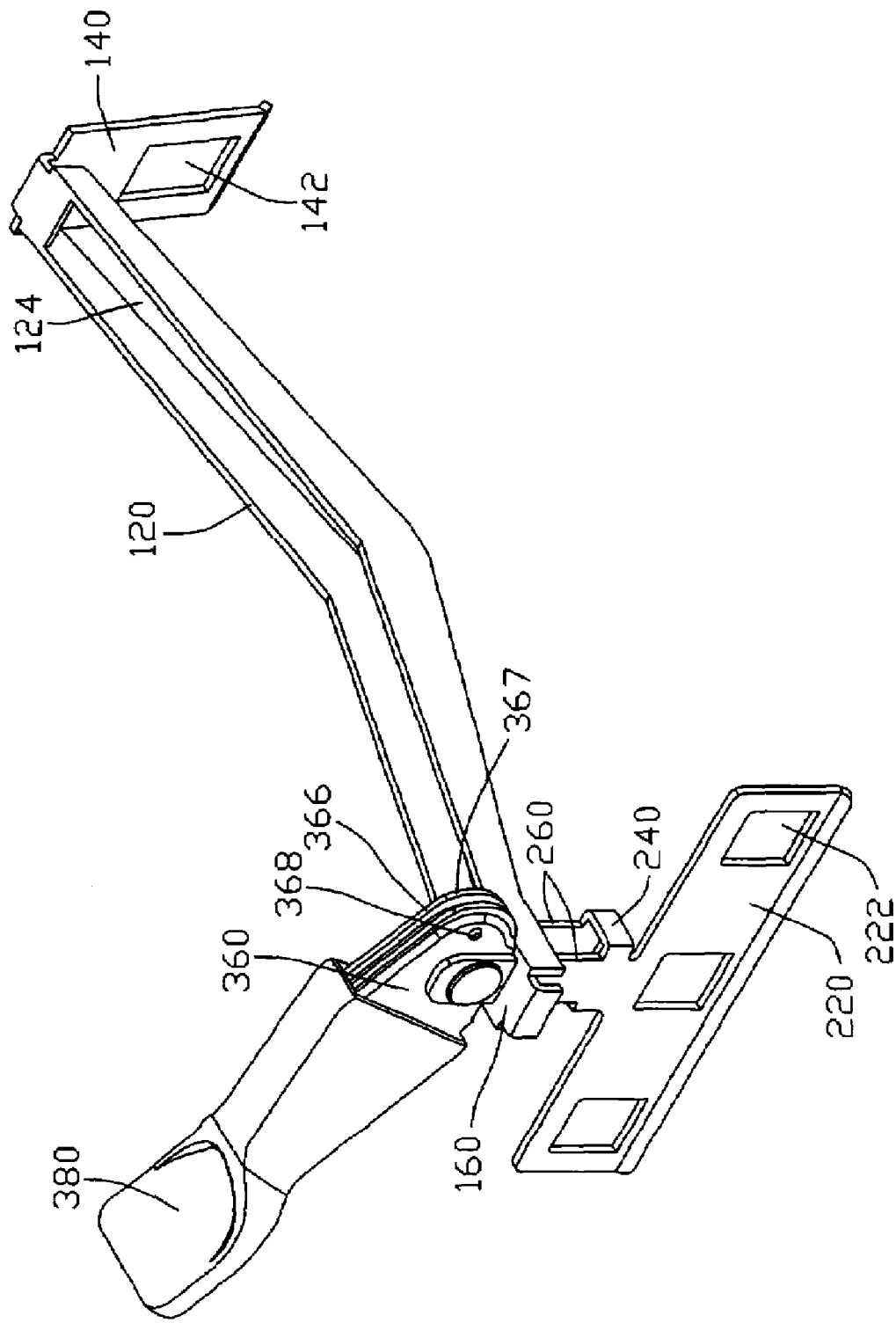
FIG. 2 is an assembled view of FIG. 1.
Figure 3:
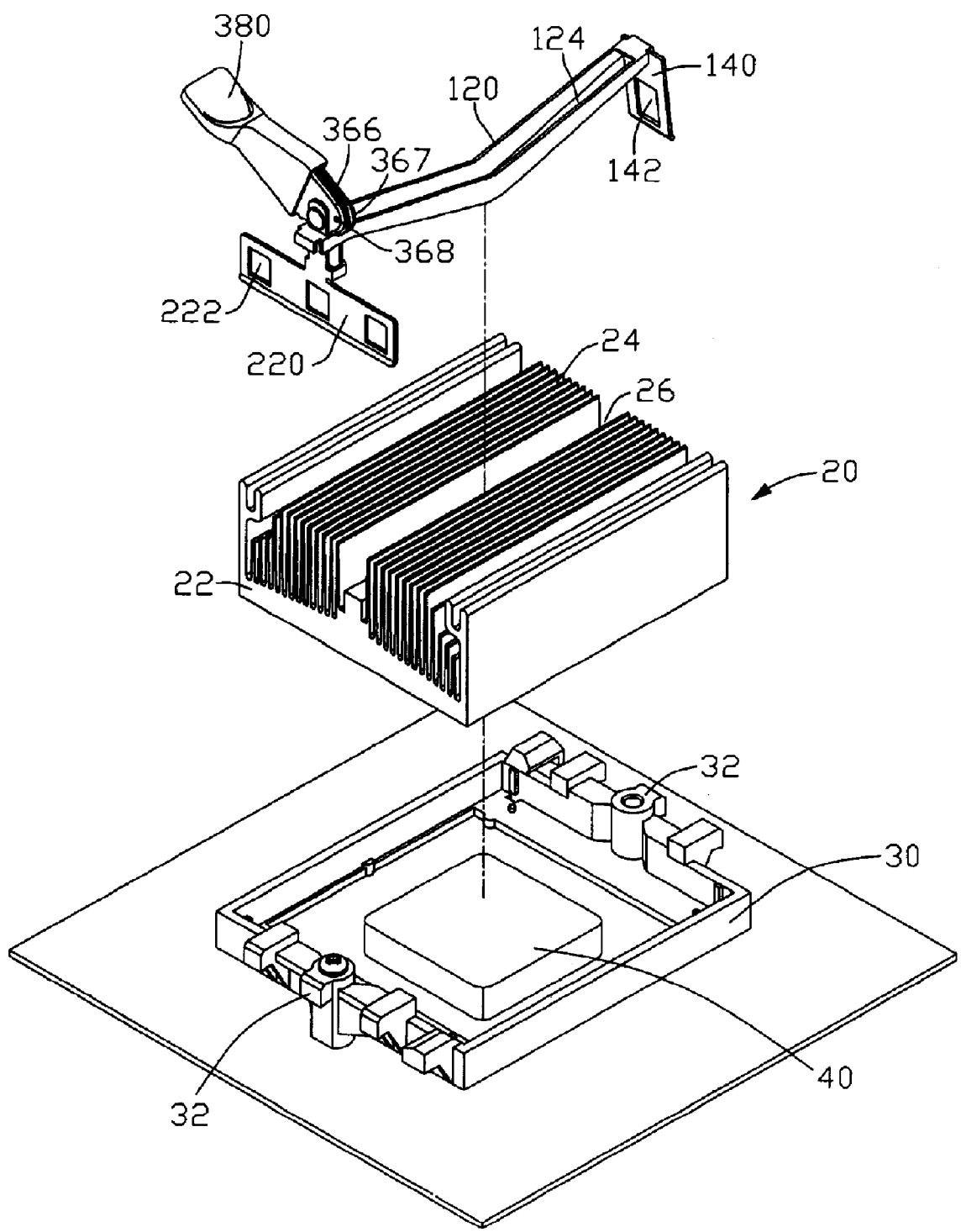
FIG. 3 is an exploded, isometric view of the heat sink fastener of FIG. 1, together with a heat sink and a heat-generating component mounted on a printed circuit board.

Referring to FIGS. 1-2, a heat sink fastener (not labeled) in accordance with a preferred embodiment of the invention comprises a main body 100, a piercing body 200, and an operating member 300.

The main body 100 comprises an elongated pressing part 120, a latching leg 140 and an engaging part 160. The latching leg 140 extends downwardly and outwardly, forming a free end of the pressing part 120, and defines an opening 142 therein. The engaging part 160 extends horizontally from an opposite end of the pressing part 120, and defines two separate engaging slots 162 therein. One slot 162 is located adjacent to the pressing part 120. The pressing part 120 between two ends thereof is provided with an elongated groove 124 for saving material.

The piercing body 200 comprises a vertical piercing part and a latching part 220 below the piercing part. The piercing part comprises two piercing plates 260 which are separate from and parallel to each other and a bottom thereof connected by a connecting part 240. The latching part 220 extends horizontally from a bottom end of an outer one of the piercing plates 260. Each piercing plate 260 can extend through a corresponding groove 162 of the engaging part 160 of the main body 100, and defines a bore 262 therein. The bores 262 are disposed above the engaging part 160 and the connecting part 240 is disposed below the engaging part 160 when the fastener is assembled together. The latching part 220 faces the latching leg 140, when the piercing body 200 is engaged to the main body 100. The latching part 220 defines at least one opening 222 therein.

The operating member 300 can be fabricated by stamping a metallic piece, such as stainless steel. The operating member 300 comprises a handle 320, a cam 360 and a plastic slipcover 380. The handle 320 formed in one end of the operating member 300 is received in the plastic slipcover 380 for enhancing the comfort of operating the handle 320 by hand to drive the cam 360. The cam 360 formed in the opposite end of the operating member 300 has an engagement portion 366 and a release portion 364 in a periphery thereof. A pivot hole 362 axially extends through the cam 360. The distance between the pivot hole 362 and the engagement portion 366 is greater than that between the pivot hole 362 and the release portion 364. Each side of the cam 360 forms an outer protrusion 368 stamped from an inside to an outside of the cam 360 between the pivot hole 362 and an end distal from the handle 320 of the cam 360. The edge on the periphery of the cam 360 which is kept in closely contact with the engaging part 160 in the rotating of the cam 360, is stamped from an outside to an inside of the cam 360 to form a bent flange 367. The flange 367 has a width which is large than a thickness of a stainless steel sheet for forming the handle 320 and the cam 360.

FIG. 2 shows the fastener in an assembled state. The cam 360 of the operating member 300 is supported on the engaging part 160. The piercing plates 260 extend through the slots 162 of the engaging part 160 respectively. A pivot 500 is then extended through the bores 262 of the piercing plates 260 and the pivot hole 362 of the cam 360 to make the operating member 300 and the piercing body 200 pivotally connected together. The cam 360 is disposed between the piercing plates 260. The piercing plates 260 are movable up and down in the slots 162 of the engaging part 160. The latching part 220 of the piercing plate 260 and the latching leg 140 face each other from opposite ends of the pressing part 120. The operating member 300 can be operated to rotate about the pivot 500 relative to the piercing body 200 between a locked position where the engagement portion 366 is maintained in close contact with the engaging part 160, and an unlocked position where the release portion 364 is maintained in close contact with the engaging part 160.

Figure 4:
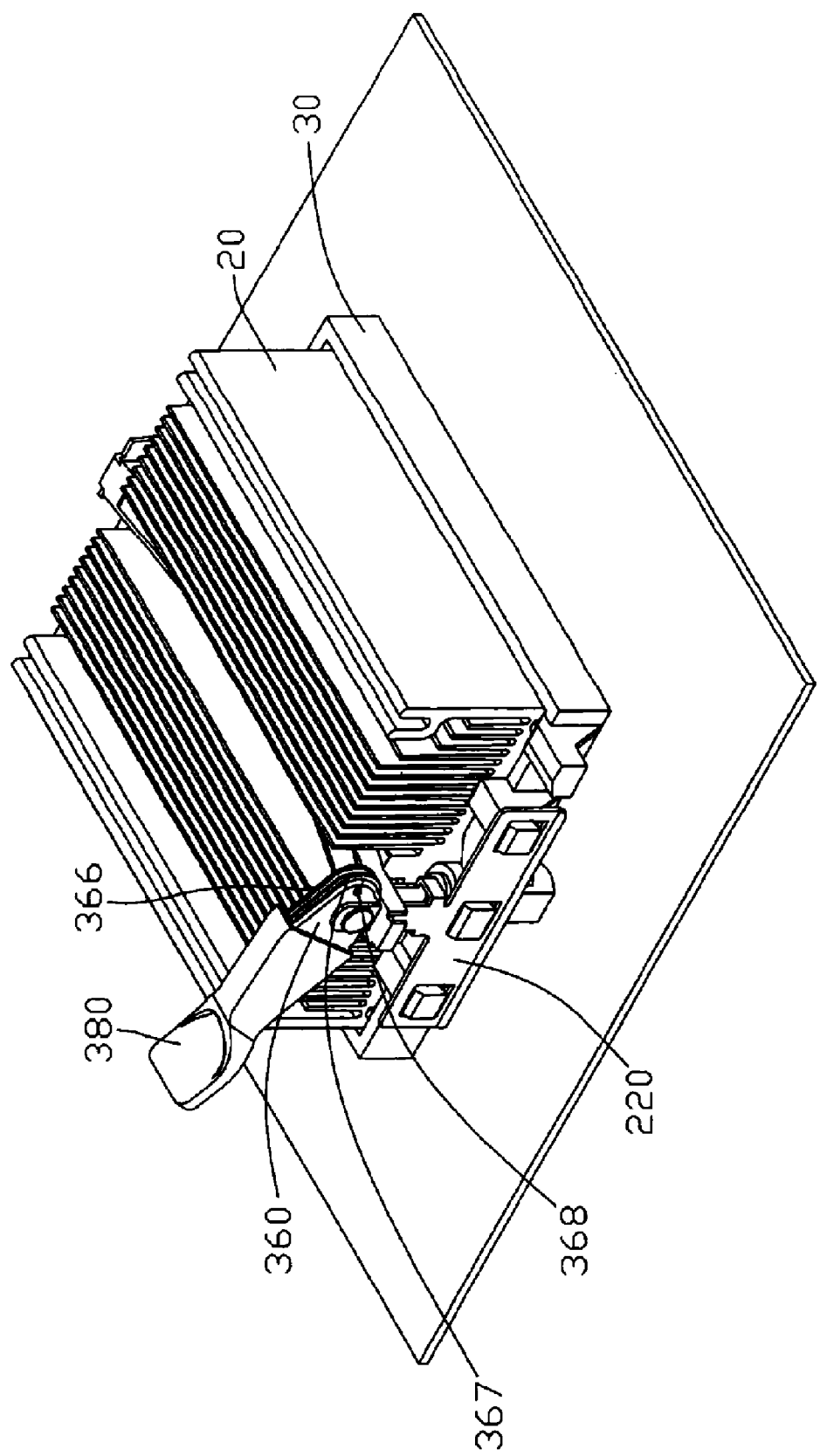
FIG. 4 is an assembled, isometric view of FIG. 3, wherein the heat sink fastener is in a unlocked position.

Referring to FIGS. 3-6, the fastener can be used to secure a heat sink 20 which is supported and surrounded by a retention module 30 on a printed circuit board (not labeled). The retention module 30 is used, in cooperation with the fastener, to fix the heat sink 20 to a heat-generating component 40 such as a CPU mounted on the printed circuit board. The retention module 30 comprises three catches 32 at each of two opposite sides thereof. The heat sink 20 comprises a base 22 in contact with a top surface of the heat-generating component 40 and a plurality of fins 24 extending upwardly from the base 22. A channel 26 is defined through the fins 24 and spans between the catches 32 of the retention module 30. With reference to FIG. 4, the pressing part 120 of the fastener is positioned in the channel 26 of the heat sink 20. The openings 142, 222 of the latching leg 140 and the latching part 220 respectively loosely receive the catches 32 of the retention module 30, wherein the opening 142 receives one corresponding catch 32 while the openings 222 receive three corresponding catches 32. The fastener is in an unlocked position in FIGS. 4-5. The release portion 364 of the operating member 300 rests on the engaging part 160 of the main body 100.

Figure 5:
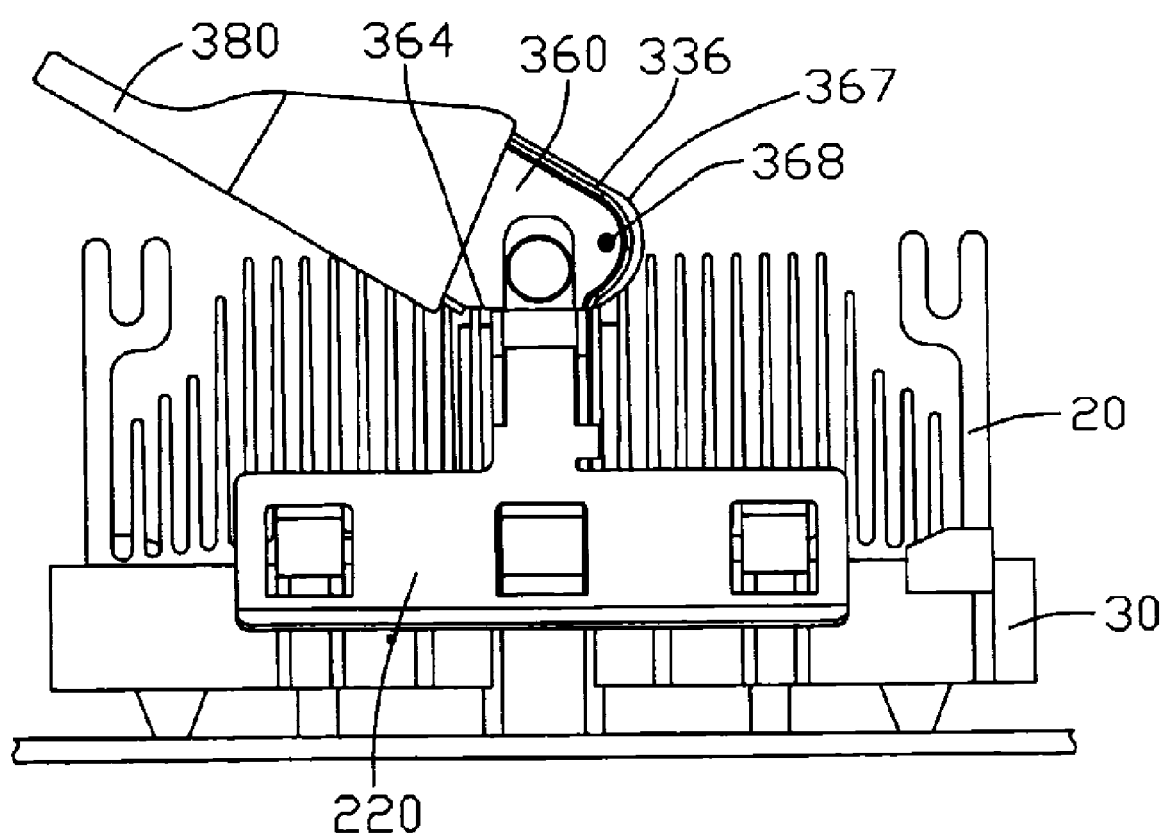
FIG. 5 is a front side view of FIG. 4.
Figure 6:
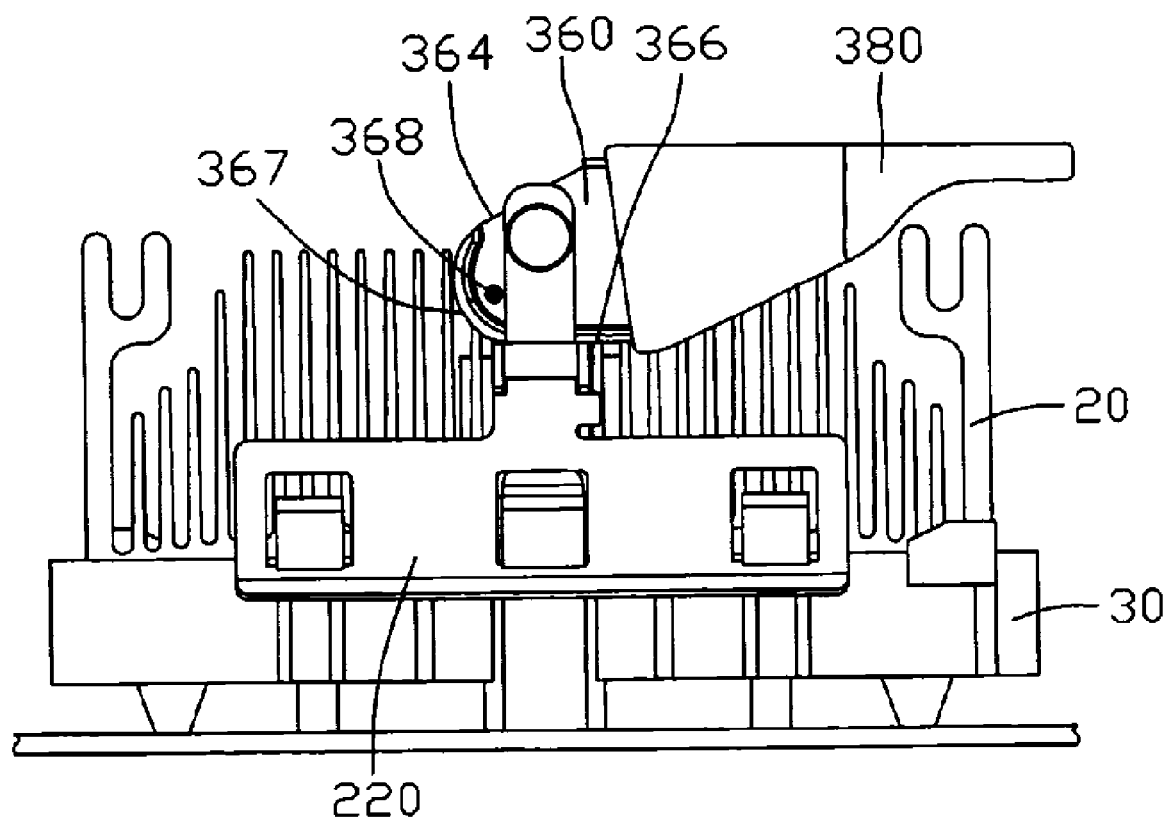
FIG. 6 is similar to FIG. 5, but showing the fastener in a locked position.

Referring to FIGS. 5-6, when the operating member 300 is turned from the unlocked position to the locked position, the engagement portions 366 of the cam 360 are driven to abut against the engaging part 160. The engaging part 160 of the main body 100 is depressed by the cam 360. The latching leg 140 and the piercing body 200 are simultaneously lifted to engage the corresponding catches 32 of the retention module 30. In the rotation of the cam 360, the protrusion 368 of the cam 360 slips laterally from one side to the opposite side of piercing plate 260, and then abuts the lateral edge of the piercing plate 260 to prevent the operating member 300 from spontaneously rotating back. The bent flange 367 formed on the periphery of the cam 360 successively prevents the edges of the cam 360 from sliding into the slots 162 of the engaging part 160. As show in FIG. 6, when the fastener is in the locked position, the latching part 220 and the latching leg 140 engage with the catches 32 of the retention module 30, and the pressing part 120 is caused to exert an urging force on the base 22 of the heat sink 20 toward the heat-generating component 40. At this time, the heat sink 20 is firmly mounted to the retention module 30 and intimately contacts the heat-generating component 40.

To detach the heat sink 20 from the retention module 30, the operating member 300 is turned from the locked position to the unlocked position. The engagement portion 366 of the cam 360 is driven to move away from the engaging part 160 to relax the pressing part 120. The latching leg 140 and the latching part 220 descend, having the openings 142, 222 loosely receiving the corresponding catches 32 of the retention module 30. At this time, the fastener can be removed, and the heat sink 20 can thus be detached from the retention module 30.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink fastener comprising:
   a main body comprising an elongated pressing part adapted for holding a heat sink in contact with a heat-generating component, an engaging part and a latching leg respectively at opposite ends of the pressing part;
   a piercing body comprising a piercing part extending through the engaging part of the main body and a latching part extending downwardly from the piercing part and facing the latching leg of the main body; and
   an operating member comprising a handle at one end thereof, an cam at opposite ends thereof, the cam pivotally connecting to the piercing part of the piercing body and supported on the engaging part of the main body, the cam forming a protrusion adjacent to an free end thereof, the protrusion being selectively disposed at one of two opposite lateral sides of the piercing part of the piercing body to hold the fastener in one of an unlocked position and a locked position.

2. The heat sink fastener as claimed in claim 1, wherein the protrusion abuts the lateral edge of the piercing part when the fastener is in the locked position.

3. The heat sink fastener as claimed in claim 1, wherein the cam comprises a bent flange by stamping an edge on a periphery thereof from an outside to an inside thereof.

4. The heat sink fastener as claimed in claim 3, wherein the bent flange is kept in contact with the engaging part of the main body when the fastener is in the locked position.

5. The heat sink fastener as claimed in claim 1, wherein the cam has an axially extended pivot hole and has an engagement portion and a release portion formed on a periphery thereof, a distance between the pivot hole and the engagement portion is greater than that between the pivot hole and release portion.

6. The heat sink fastener as claimed in claim 1, wherein the engaging part defines two separate grooves therein for the piercing part to extend therethrough, one of the grooves being adjacent to the pressing part.

7. The heat sink fastener as claimed in claim 6, wherein the piercing part is movable up and down in the grooves of the engaging part.

8. The heat sink fastener as claimed in claim 1, wherein the piercing part comprises two piercing plates parallel to each other and pivotally connecting with the cam of the operating member.

9. The heat sink fastener as claimed in claim 8, wherein the piercing plates at a bottom thereof are connected by a connecting part.

10. The heat sink fastener as claimed in claim 1, wherein the operating member further comprises a plastic slipcover to accommodate the handle.

11. A fastener comprising:
- a main body comprising a pressing part adapted for holding a heat sink in contact with a heat-generating component, an engaging part and a latching leg, the engaging part and the latching leg being disposed at opposite ends of the pressing part;
- a piercing body comprising a piercing part piercing through the engaging part and movable up and down through the engaging part, and a latching part located below the piercing part and facing the latching leg; and
- an operating member comprising a cam at a free end thereof, which is pivotally connected to the piercing part and rotatable to put the pressing part under tension by exerting a force on the engaging part, and also rotatable to relax the tension by relieving the force exerted on the engaging part, the cam forming a protrusion abutting a lateral edge of the piercing part to prevent the operating member from spontaneously rotating back when in the locked position.

12. The fastener as claimed in claim 11, wherein the cam comprises a bent flange on an edge thereof.

13. The fastener as claimed in claim 12, wherein the bent flange is kept in contact with the engaging part of the main body when the fastener is in the locked position.

14. A heat sink assembly comprising:
- a printed circuit board;
- a heat-generating electronic component mounted on the printed circuit board;
- a retention module mounted on the printed circuit board and surrounding the electronic component;
- a heat sink mounted on the electronic component and thermally connecting therewith;
- a fastener having an elongate body pressing the heat sink against the electronic component, a latching leg integrally depending from one end of the elongate body and securely engaging with the retention module, a piercing body having an upper piercing part extending upwardly through another end of the elongate body and a lower latching part securely engaging with the retention module, and an operating member having a cam pivotably connected to the piercing part at a location above the another end of the elongate body and a handle for driving the cam to rotate;
- wherein the cam has a periphery formed with a bent flange extending a width from the periphery of the cam and in contact with the another end of the elongate body;
- wherein the cam farther forms a protrusion thereon, the protrusion abutting against a side of the piercing part to prevent the cam from spontaneous rotation.

15. The heat sink assembly as claimed in claim 14, wherein the width is larger than a thickness of a metal sheet for forming the cam.

* * * * *